US007221190B2

(12) United States Patent
Partow et al.

(10) Patent No.: US 7,221,190 B2
(45) Date of Patent: May 22, 2007

(54) DIFFERENTIAL COMPARATOR WITH EXTENDED COMMON MODE VOLTAGE RANGE

(75) Inventors: Anthony Sepehr Partow, Addison, TX (US); Ricky Dale Jordanger, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 11/079,711

(22) Filed: Mar. 14, 2005

(65) Prior Publication Data

US 2006/0202721 A1    Sep. 14, 2006

(51) Int. Cl.
*H03K 5/22* (2006.01)
(52) U.S. Cl. .......................... 327/65; 327/563
(58) Field of Classification Search ............... None
See application file for complete search history.

(56) References Cited

U.S. PATENT DOCUMENTS 5,512,848 A * 4/1996 Yaklin ..................... 327/65
6,255,863 B1 * 7/2001 Yamauchi et al. ............ 327/65
6,504,404 B2 * 1/2003 Uchiki et al. ................ 327/65

* cited by examiner

*Primary Examiner*—Timothy P. Callahan
*Assistant Examiner*—Terry L. Englund
(74) *Attorney, Agent, or Firm*—W. James Brady, III; Frederick J. Telecky, Jr.

(57) ABSTRACT

A system and method is provided for extending the range of a common mode voltage of a differential comparator. In one embodiment, a differential comparator comprises an input stage with a negative voltage reference node, a first differential input coupled to a first differential pair transistor and operative to receive a first input signal, and a second differential input coupled to a second differential pair transistor and operative to receive a second input signal. The first input signal and the second input signal form a differential input signal. The differential comparator further comprises a common mode sensing circuit interconnected between the first differential input, the second differential input, and the negative voltage reference node. The common mode sensing circuit is operative to sense a common mode voltage of the differential input signal and set a voltage potential at the negative voltage reference node substantially equal to the sensed common mode voltage.

12 Claims, 4 Drawing Sheets

DIFFERENTIAL COMPARATOR WITH EXTENDED COMMON MODE VOLTAGE RANGE

TECHNICAL FIELD

This invention relates to electronic circuits, and more specifically to differential comparator circuits.

BACKGROUND

Many types of electronic equipment, such as transceivers and other communications equipment, require differential comparators. Differential comparators are electrical circuits that compare two input signals, such as a differential signal, and generate an output that corresponds to the values of the input signals relative to each other. For example, a typical differential comparator will receive a reference signal and an input signal, such that the differential comparator will output a high (e.g., logic 1) signal when the voltage of the input signal is greater than the voltage of the reference signal and a low (e.g., logic 0) signal when the voltage of the input signal is less than the voltage of the reference signal.

The common mode voltage is the average voltage between a differential signal pair. Many communications architectures and standards require a certain range in which the common mode voltage of a differential signal resides. However, the common mode voltage range of a differential comparator is typically dictated by the performance limitations of its input stage. For example, the lower limit of the common mode voltage range in a differential comparator is limited by the voltage required to keep a differential pair in the input stage in a constant current region (saturation mode). In other words, the differential pair needs to operate in saturation mode for the differential comparator to function properly, and for the differential pair to operate in saturation mode, the common mode voltage needs to be sufficiently positive relative to the negative supply voltage of the differential comparator. Thus the common mode voltage range is significantly limited.

Techniques have been applied to circuit designs such that negative common mode voltage potentials can be accommodated in circuits that contain differential comparators. One example is a divide and shift network. A divide and shift network extends the common mode voltage range by compressing and DC shifting the differential input signal to create a common mode voltage that is within the operable range of a differential comparator. Thus, a differential signal is created that is proportional to the actual differential input signal, such that the common mode voltage signal of the proportional differential input signal can fall within the constraints of the differential comparator. This solution, however, consumes additional power, thus making it unsuitable for low power applications, such as communications devices operating in "sleep mode."

SUMMARY

One embodiment of the present invention includes a differential comparator comprises an input stage with a negative voltage reference node, a first differential input coupled to a first differential pair transistor and operative to receive a first input signal, and a second differential input coupled to a second differential pair transistor and operative to receive a second input signal. The first input signal and the second input signal form a differential input signal. The differential comparator further comprises a common mode sensing circuit interconnected between the first differential input, the second differential input, and the negative voltage reference node. The common mode sensing circuit is operative to sense a common mode voltage of the differential input signal and set a voltage potential at the negative voltage reference node substantially equal to the sensed common mode voltage.

Another embodiment of the present invention includes a method for extending the range of a common mode voltage of a differential comparator input. The method comprises receiving a first input signal at a first differential input and a second input signal at a second differential input in an input stage of the differential comparator. The first input signal and the second input signal form a differential input signal. The method further comprises sensing the common mode voltage of the differential input signal, and setting a negative voltage reference node of the input stage of the differential comparator to a value that is substantially equal to the sensed common mode voltage of the differential input signal.

Another embodiment of the present invention includes a differential comparator comprising means for receiving a differential input signal and means for setting the voltage of a negative voltage reference node of an input stage of the differential comparator substantially equal to a sensed common mode voltage of the differential input signal.

DETAILED DESCRIPTION

The present invention relates to electronic circuits, and more specifically to differential comparator circuit that provides a common mode voltage range for a differential comparator that can be extended by sensing the common mode voltage of the differential signal and setting a negative reference voltage of an input stage of the differential comparator substantially equal to the sensed common mode voltage. In accordance with an aspect of the invention, if the common mode voltage of the differential signal is less than the negative supply voltage of the differential comparator, so also will be the negative reference voltage of the differential pair. Therefore, the operable common mode voltage range of the differential comparator can have a lower limit that may be greater than or less than the negative supply voltage of the differential comparator.

Figure 1:
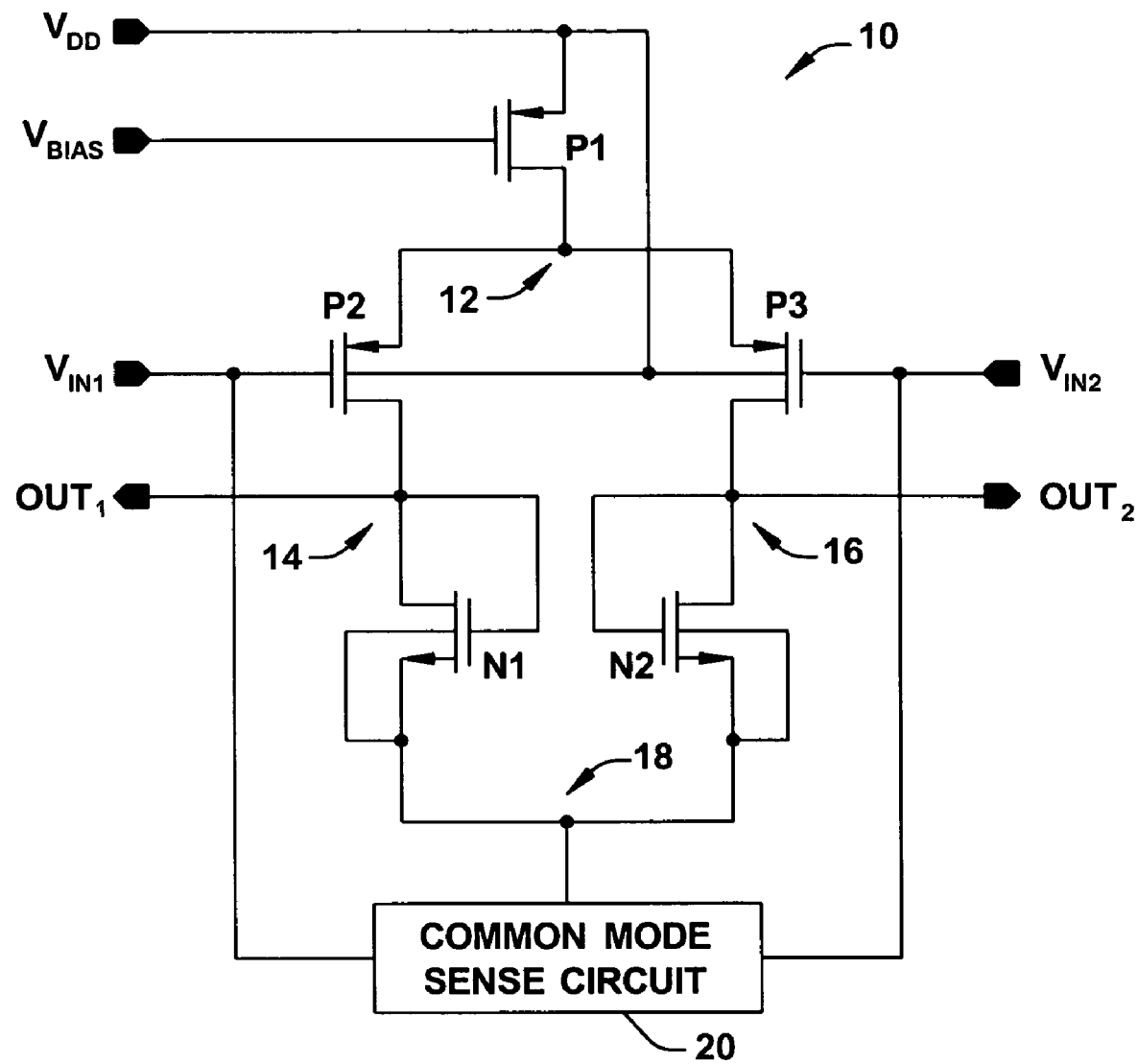
FIG. 1 illustrates an input stage of a differential comparator circuit in accordance with an aspect of the invention.

FIG. 1 illustrates an example of an input stage 10 of a differential comparator circuit in accordance with an aspect of the invention. The input stage 10 has a positive supply voltage $V_{DD}$, which has a corresponding negative supply voltage $V_{SS}$ (not shown). The input stage 10 also receives a bias voltage $V_{BIAS}$, which is electrically connected to a gate terminal of a P-type field effect transistor (FET) P1. $V_{BIAS}$ is of a voltage potential that is sufficiently low relative to the positive supply voltage $V_{DD}$ such that the transistor P1 operates in a constant current region (e.g., saturation mode).

Thus, a sufficient current flows through the transistor P1 from the positive supply voltage $V_{DD}$ to the node 12. The input stage 10 also receives a differential signal $V_{IN}$ at input terminals $V_{IN1}$ and $V_{IN2}$, respectively, and outputs a pair of output signals at output terminals $OUT_1$ and $OUT_2$, respectively.

The transistor P1 has a source terminal that is electrically connected to the positive supply voltage $V_{DD}$ and a drain terminal that is electrically connected to a node 12. The node 12 also interconnects source terminals of P-type FETs P2 and P3. The transistors P2 and P3 each have a gate terminal connected to one of the inputs of the differential signal, with $V_{IN1}$ being connected to the gate of P2 and $V_{IN2}$ being connected to the gate of P3. Each of the transistors P2 and P3 have bulk terminals that are connected to each other, which are also connected to the positive supply voltage $V_{DD}$. The transistor P2 has a drain terminal that is connected to a node 14, which also includes an output terminal $OUT_1$, and the transistor P3 has a drain terminal that is connected to a node 16, which also includes an output terminal $OUT_2$.

The transistors P2 and P3 are differential pair transistors that operate to pass the current flowing from the transistor P1 through the transistors P2 and P3 in amounts that are proportional to the differential signal applied at the inputs $V_{IN1}$ and $V_{IN2}$. The amount of voltage present at the inputs $V_{IN1}$ and $V_{IN2}$ dictates the amount of source-to-gate voltage ($V_{GS}$) drop across the transistors P2 and P3, such that a larger amount of a bias current flows through the transistor with the highest $V_{GS}$. For example, if the voltage at the input $V_{IN1}$ is higher than the voltage at the input $V_{IN2}$, the transistor P3 will have a higher $V_{GS}$ and will thus pass more bias current into the node 16 than the transistor P2 into the node 14.

The input stage 10 also includes an N-type FET N1 and an N-type FET N2. The transistor N1 has a gate and a drain terminal that are connected to the node 14, and the transistor N2 has a gate and a drain terminal that are connected to the node 16. Both the transistor N1 and the transistor N2 have a source terminal and a bulk terminal that are connected to a node 18, which is a negative voltage reference node for the input stage 10. Because the transistors N1 and N2 have their respective gate and drain terminals connected together, they are said to be diode connected such that they are always on and have a drain-to-source voltage ($V_{DS}$) that is equal to the respective transistor's $V_{GS}$.

The transistors N1 and N2 thus receive the bias currents at their respective drain and gate terminals. As the current flows into the nodes 14 and 16, the transistors N1 and N2 see an increase in their respective $V_{DS}$ voltage potentials, which is also reflected at the output terminals $OUT_1$ and $OUT_2$, referenced to the node 18. These $V_{DS}$ voltage potentials at the output terminals $OUT_1$ and $OUT_2$ are directly proportional to the voltage potentials at the input terminals $V_{IN1}$ and $V_{IN2}$, respectively.

In a typical input stage of a differential comparator, the node 18 would be tied to the negative supply voltage $V_{SS}$. However, in accordance with an aspect of the invention, a common mode sense circuit 20 is coupled to the node 18 and coupled between the input terminals $V_{IN1}$ and $V_{IN2}$. The common mode sense circuit 20 senses the common mode voltage of the differential signal at the input terminals $V_{IN1}$ and $V_{IN2}$ and sets the node 18 equal to the sensed common mode voltage. The common mode sense circuit 20 thus tracks the common mode voltage to allow the differential comparator to operate in an extended common mode voltage range which could be greater than or less than the negative supply voltage $V_{SS}$.

As described above, the lower limit of the common mode voltage range in a differential comparator is limited by the voltage required to maintain operation of a differential pair in saturation mode. Thus, in the example of FIG. 1, the transistors P2 and P3 (the differential pair) operate in saturation mode. As such, the transistors P2 and P3 have a $V_{DS}$ voltage that is greater than a respective $V_{GS}$ voltage, meaning that the drain voltage is higher than the gate voltage, referenced to the source. However, if the node 18 was connected to the negative supply voltage $V_{SS}$, as in the example of a typical differential comparator, the voltage potentials at the nodes 14 and 16 would be required to be greater than the negative supply voltage $V_{SS}$ because the transistors N1 and N2 are diode connected. Thus, the differential comparator could not operate with a common mode voltage range that is less than the negative supply voltage $V_{SS}$. However, by setting the node 18 equal to the sensed common mode voltage, the respective $V_{DS}$ voltage potentials of the transistors N1 and N2 are not referenced to the negative supply voltage $V_{SS}$, but are instead referenced to the common mode voltage. Thus, if the common mode voltage is less than the negative supply voltage $V_{SS}$, then the voltage potentials of the output terminals $OUT_1$ and $OUT_2$ could also be less than the negative supply voltage $V_{SS}$. Therefore, in accordance with an aspect of the invention, the common mode sense circuit 20 operates to extend the common mode voltage range of the differential comparator.

It is to be understood that the bulk terminals of the transistors N1 and N2 are not internally coupled to a substrate that is coupled to ground (e.g., the negative supply voltage $V_{SS}$). Instead, the transistors N1 and N2 are either isolated transistor devices, such that they have a P-type substrate that is not grounded, or are manufactured using a twin-well process, such that they include a P-type semiconductor well separate from a grounded P-type substrate. Such an arrangement allows the transistors N1 and N2 to conduct current in the negative direction (e.g., when the node 18 is at a voltage potential less than the negative supply voltage $V_{SS}$) without being clamped by parasitic diodes within the bodies of the transistors N1 and N2. In addition, it is to be understood that the common bulk connection of the transistors P2 and P3 to the positive supply voltage VDD raises the threshold voltage of the transistors P2 and P3 through the transistor body effect, such that the negative common mode voltage range is further extended.

Figure 2:
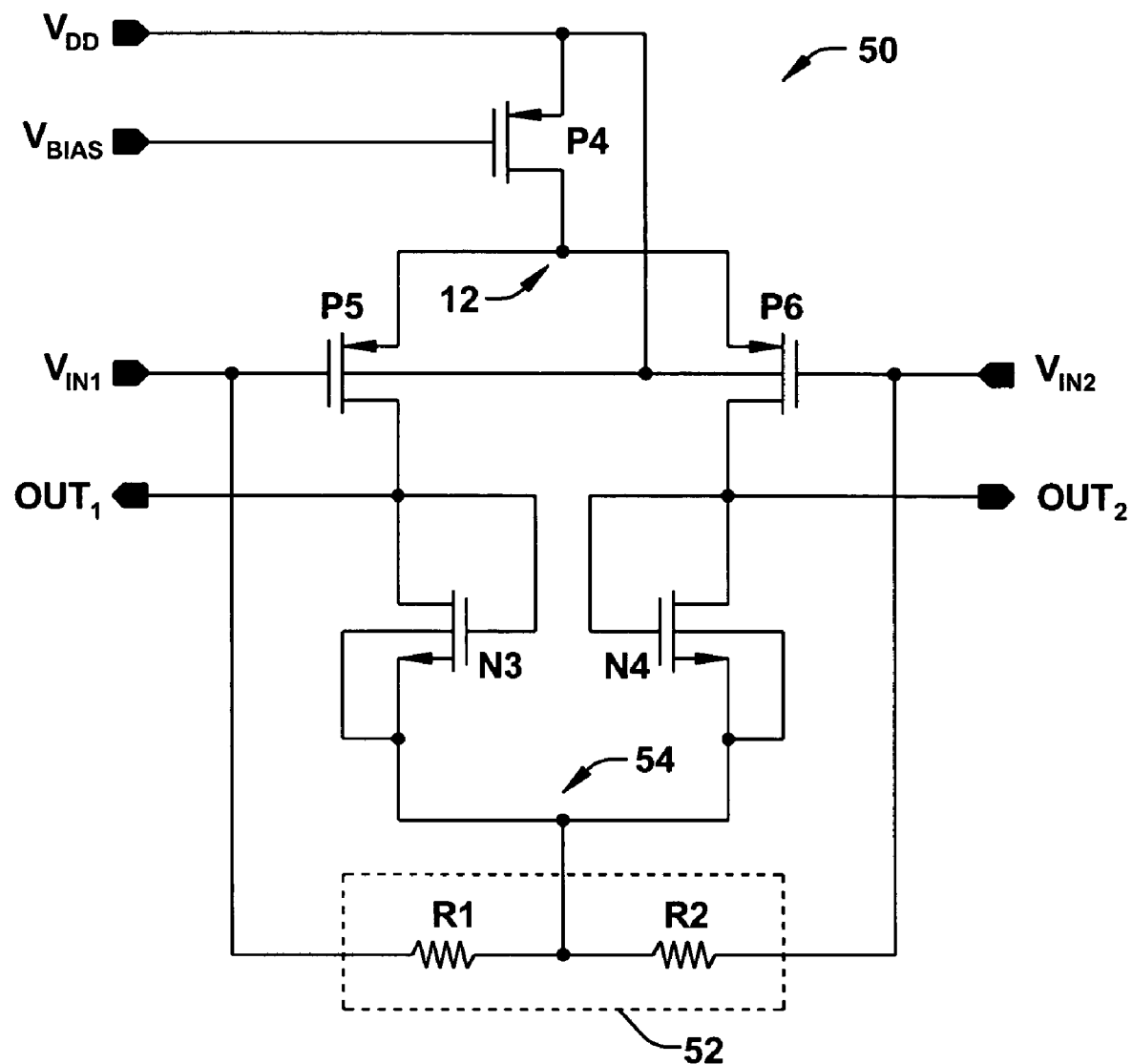
FIG. 2 illustrates an input stage of a differential comparator circuit in accordance with another aspect of the invention.

FIG. 2 illustrates an example of an input stage 50 of a differential comparator, in accordance with an aspect of the invention. The input stage 50 includes three P-type FETs P4, P5 and P6; two N-type FETs N3 and N4; and a common mode sense circuit 52. The input stage 50 of FIG. 2 is substantially identical to the input stage 10 of FIG. 1 and thus operates substantially the same. In the example of FIG. 2, the current mode sense circuit 52 includes two resistors, R1 and R2, that are arranged in series as a voltage divider between input terminals $V_{IN1}$ and $V_{IN2}$ and a node 54. Accordingly, if the values of the resistors R1 and R2 are substantially equal to each other, the voltage potential at the node 54 will be the common mode voltage of the differential signal at the input terminals $V_{IN1}$ and $V_{IN2}$.

By setting the node 54 equal to the common mode voltage, the respective $V_{DS}$ voltage potentials of the transistors N1 and N2 are not referenced to the negative supply voltage $V_{SS}$, but are instead referenced to the common mode voltage. Thus, if the common mode voltage is less than the negative supply voltage $V_{SS}$, then the voltage potentials of the output terminals $OUT_1$ and $OUT_2$ could also be less than the negative supply voltage $V_{SS}$. Therefore, in accordance with an aspect of the invention, the common mode sense circuit 52 operates to extend the common mode voltage range of the differential comparator.

The voltage divider that is the common mode sense circuit 52, in accordance with an aspect of the invention, consumes minimal additional power for the purpose of extending the operable common mode voltage range of the differential comparator circuit within which the input stage 50 is included. However, it is to be understood that the common mode sense circuit 52 need not be a voltage divider that includes a series connection of resistors with substantially equal values. Any other type of circuit or arrangement of circuit components that is operable to sense the common mode voltage of the differential signal and further operable to set the node 54 equal to the common mode voltage could be used in the input stage 50 instead.

Figure 3:
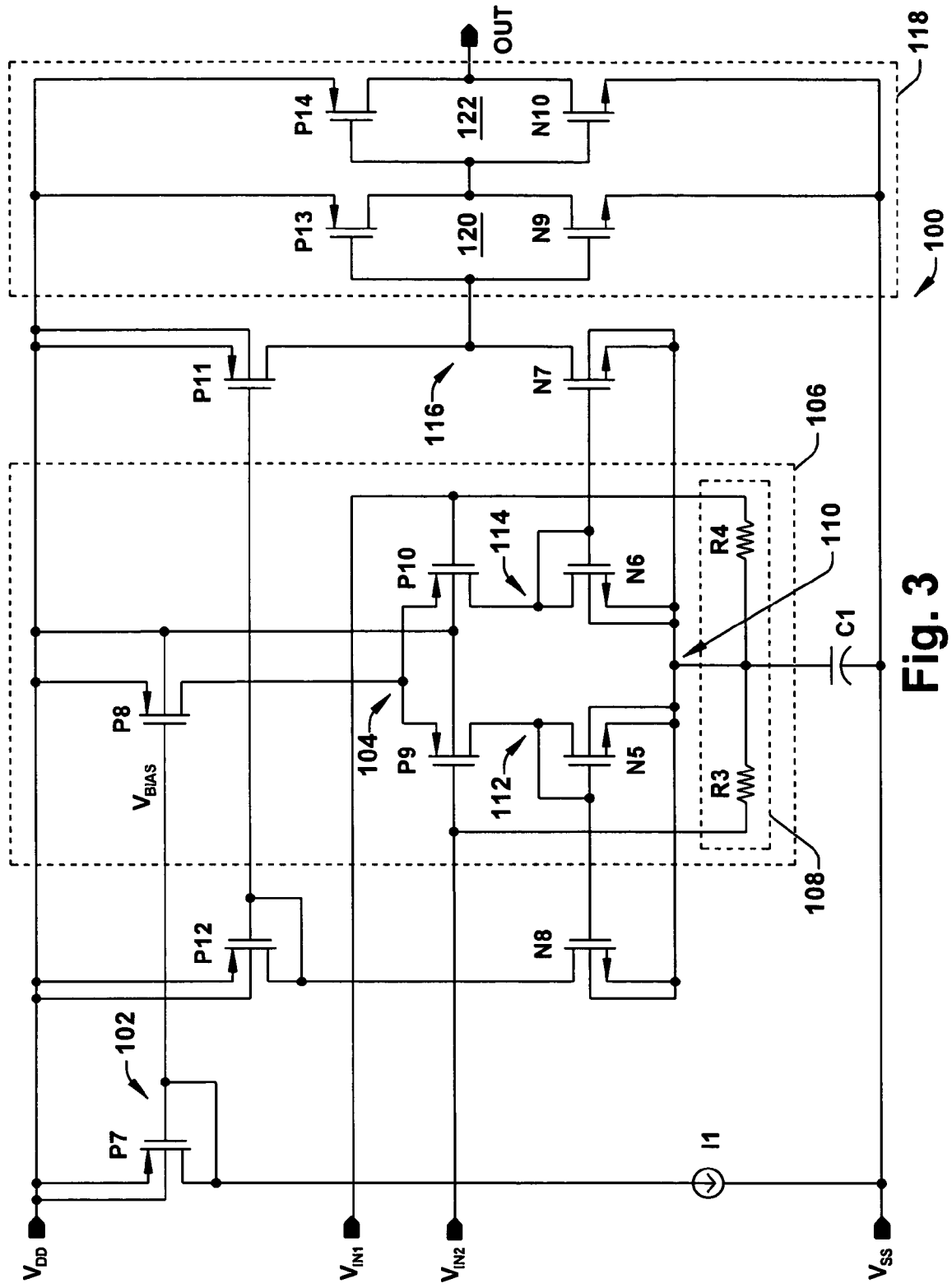
FIG. 3 illustrates a differential comparator circuit in accordance with an aspect of the invention.

FIG. 3 illustrates a differential comparator circuit 100 in accordance with an aspect of the invention. The differential comparator circuit 100 has a positive supply voltage $V_{DD}$ and a corresponding negative supply voltage $V_{SS}$. Coupled between the positive supply voltage $V_{DD}$ and the negative supply voltage $V_{SS}$ is a P-type FET P7 and a current source I1. The transistor P7 is diode connected, with a gate terminal and a source terminal connected to a node 102. The combination of the diode connection of the transistor P7 and the current source I1 allows the transistor P7 to produce a bias voltage $V_{BIAS}$ at the node 102. The node 102 is electrically connected to a gate terminal of a P-type FET P8 that is part of an input stage 106 of the differential comparator circuit 100. $V_{BIAS}$ is of a voltage potential that is sufficiently low relative to the positive supply voltage $V_{DD}$ to cause the transistor P8 to operate in saturation mode, such that a sufficient current flows through the transistor P8 from the positive supply voltage $V_{DD}$ to a node 104 within the input stage 106. The differential comparator circuit 100 also receives a differential signal $V_{IN}$ at input terminals $V_{IN1}$ and $V_{IN2}$, respectively.

The input stage 106 also includes two P-type FETs P9 and P10, two N-type FETs N5 and N6, and a common mode sense circuit 108 that includes two resistors R3 and R4 arranged in series as a voltage divider. The input stage 106 is substantially identical to the input stage 50 in the example of FIG. 2 and thus operates substantially the same. Particularly, the common mode sense circuit 108 detects the common mode voltage of the differential signal at the input terminals $V_{IN1}$ and $V_{IN2}$ and sets a node 110 equal to the common mode voltage. By setting the node 110 equal to the common mode voltage, the respective $V_{DS}$ voltage potentials of the transistors N5 and N6 are not referenced to the negative supply voltage $V_{SS}$, but are instead referenced to the common mode voltage. Thus, if the common mode voltage is less than the negative supply voltage $V_{SS}$, then the voltage potentials at nodes 112 and 114 (e.g., the outputs of the input stage 106) could also be less than the negative supply voltage $V_{SS}$. Therefore, in accordance with an aspect of the invention, the common mode sense circuit 108 operates to extend the common mode voltage range of the differential comparator circuit 100.

The voltage potential at the node 112 is transferred to a gate terminal of a P-type FET P11 and the voltage potential at the node 114 is transferred to a gate terminal of an N-type FET N7. It is to be understood that the voltage potential at the node 112 is transferred to the gate terminal of the transistor P11 through an N-type FET N8 and a P-type FET P12 through current mirroring. The transistor P11 has a source terminal that is connected to the positive supply voltage $V_{DD}$ and a drain terminal that is connected to a node 116. The transistor N7 has a source terminal that is connected to the node 110 and a drain terminal that is connected to the node 116. The transistors P11 and N7 operate as a complimentary push-pull stage through which the differential comparator circuit 100 functions, thus making the node 116 correspond to the output of the differential comparator circuit 100, which is a high (e.g., logic 1) signal or a low (e.g., logic 0) signal at an output terminal OUT.

As an example of the complimentary push-pull action of the transistors P11 and N7, if the current flowing through the transistor P11 is greater than the current flowing through the transistor N7, then the transistor P11 will activate and pull the potential of the node 116 up to the positive supply voltage $V_{DD}$. However, if the current flowing through the transistor P11 is less than the current flowing through the transistor N7, then the transistor N7 will activate and pull the potential of the node 116 down to the common mode voltage of the differential signal. In other words, if the voltage at the input $V_{IN1}$ is greater than the voltage at the input $V_{IN2}$, then the voltage at the node 114 will be greater than the voltage at the node 112, and thus the node 116 will be pulled down to the common mode voltage, corresponding to a low output. However, if the voltage at the input $V_{IN1}$ is less than the voltage at the input $V_{IN2}$, then the voltage at the node 114 will be less than the voltage at the node 112, and thus the node 116 will be pulled up to the positive supply voltage $V_{DD}$, corresponding to a high output.

The differential comparator circuit 100 also includes a capacitor C1 interconnected between the node 110 and the negative supply voltage $V_{SS}$. The capacitor C1 operates to mitigate high frequency noise occurring in the node 110 by short circuiting high frequency signals to the negative supply voltage $V_{SS}$. The differential comparator circuit 100 further includes a buffer 118 coupled between the node 116 and the output terminal OUT. The buffer 118 includes two inverter stages 120 and 122, each including an N-type FET and a P-type FET pair. The inverter stage 120 includes a P-type FET P13 and an N-type FET N9, and the inverter stage 122 includes a P-type FET P14 and an N-type FET N10. The buffer 118 operates to level shift and reference the output of the differential comparator circuit 100 that corresponds to the voltage potential at the node 116 to the negative supply voltage $V_{SS}$. Therefore, the output signal of the differential comparator circuit 100 at the output terminal OUT is a digital signal corresponding to the relative voltage potentials of the differential signal at the inputs $V_{IN1}$ and $V_{IN2}$.

Figure 4:
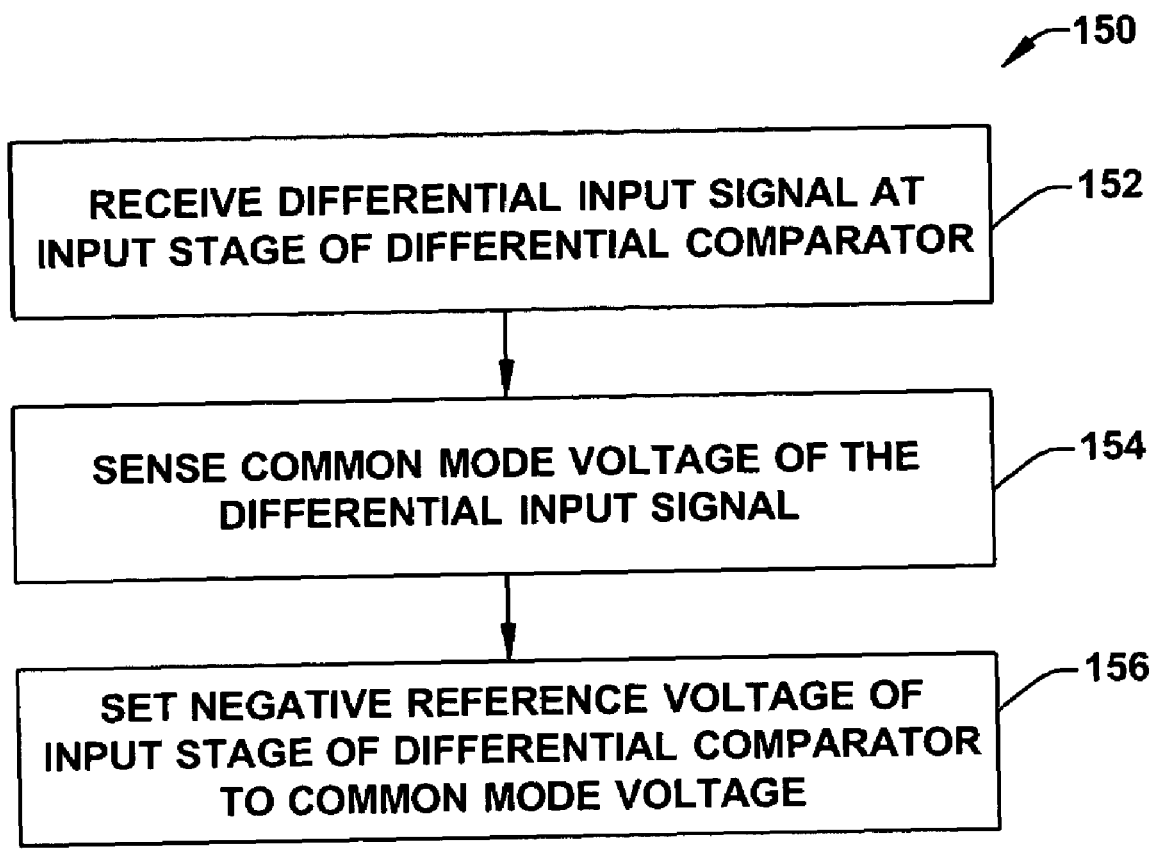
FIG. 4 illustrates a method for extending the range of a common mode voltage of a differential comparator in accordance with an aspect of the invention.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method.

FIG. 4 illustrates a method 150 for extending the range of a common mode voltage of a differential signal input to a differential comparator. At 152, the differential input signal is received at an input stage of the differential comparator. At 154, the common mode voltage of the differential input signal is sensed. The sensing of the common mode voltage of the differential input signal can occur by connecting a common mode sense circuit to the input stage of the differential comparator. The common mode sense circuit can be any type of circuit or arrangement of circuit components that can sense the common mode voltage of the differential comparator, such as a voltage divider that includes a pair of matched resistors in series. At 156, the negative reference voltage of the input stage of the differential comparator is set to the common mode voltage of the differential input signal. Therefore, if the common mode voltage of the differential input signal is less than a negative supply voltage of the differential comparator, then the voltage potentials of the outputs of the input stage of the differential comparator could also be less than the negative supply voltage. Therefore, in accordance with an aspect of the invention, the common mode sense circuit operates to extend the common mode voltage range of the differential comparator.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A differential comparator comprising:
   a first node for a first supply voltage and a second node for a second supply voltage;
   an output stage connected between said first node and said second node;
   an input stage connected between said first node and said second node, coupled to said output stage, and with a negative voltage reference node;
   a first differential input coupled to a first differential pair transistor in said input stage and operative to receive a first input signal;
   a second differential input coupled to a second differential pair transistor in said input stage and operative to receive a second input signal, the first input signal and the second input signal forming a differential input signal; and
   a common mode sensing circuit in said input stage and interconnected between the first differential input, the second differential input, and the negative voltage reference node, the common mode sensing circuit being operative to sense a common mode voltage of the differential input signal and set a voltage potential at the negative voltage reference node substantially equal to the sensed common mode voltage including when said common mode voltage lies outside of the voltage range from said first supply voltage to said second supply voltage; and
   loads, for said first differential pair transistor and said second differential pair transistor, directly connected to said negative voltage reference node.

2. The differential comparator of claim 1, wherein said negative voltage reference node is capacitively coupled to said second node for said second supply voltage.

3. The differential comparator of claim 1, wherein the common mode sensing circuit comprises a voltage divider.

4. The differential comparator of claim 3, wherein the voltage divider comprises a first resistor coupled between the first differential input and the negative voltage reference node, and a second resistor coupled between the second differential input and the negative voltage reference node.

5. The differential comparator of claim 1, wherein the first differential pair transistor comprises a first bulk terminal and the second differential pair transistor comprises a second bulk terminal, wherein the first bulk terminal and the second bulk terminal are coupled to each other and to said first supply voltage of the differential comparator.

6. The differential comparator of claim 1, wherein said loads comprise a first diode-connected transistor coupled between the first differential pair transistor and the negative voltage reference node, and a second diode-connected transistor coupled between the second differential pair transistor and the negative voltage reference node, the first diode-connected transistor and the second diode connected transistor being manufactured as one of isolated devices and twin-well devices.

7. A method for extending the range of a common mode voltage of a differential comparator input comprising:
   receiving a first input signal at a first differential input and a second input signal at a second differential input in an input stage of the differential comparator, the first input signal and the second input signal forming a differential input signal which is fed to a differential pair in said input stage;
   sensing the common mode voltage of the differential input signal; and
   setting a negative voltage reference node of the input stage of the differential comparator to a value that is substantially equal to the sensed common mode voltage of the differential input signal including when said common mode voltage lies outside of the voltage range from a first supply voltage to a second supply voltage for said differential comparator; and
   providing loads, for said differential pair, directly connected to said negative voltage reference node.

8. The method of claim 7, wherein the negative voltage reference node of the differential comparator can be set to a voltage potential value that is less than a negative supply voltage of the differential comparator.

9. The method of claim 7, wherein the common mode voltage of the differential input signal is sensed using a voltage divider.

10. The method of claim 9, wherein the voltage divider comprises a first resistor coupled between the first differential input and the negative voltage reference node, and a second resistor coupled between the second differential input and the negative voltage reference node.

11. The method of claim 7, wherein the input stage comprises a first differential pair transistor coupled to the first differential input and comprising a first bulk terminal, and a second differential pair transistor coupled to the second differential input and comprising a second bulk terminal, wherein the first bulk terminal and the second bulk terminal are coupled to each other and to a positive supply voltage of the differential comparator.

12. The method of claim 11, wherein said loads comprise a first diode-connected transistor coupled between the first differential pair transistor and the negative voltage reference node, and a second diode-connected transistor coupled between the second differential pair transistor and the negative voltage reference node, the first diode-connected transistor and the second diode connected transistor being manufactured as one of isolated devices and twin-well devices.

* * * * *